United States Patent [19]
Hsieh

[11] Patent Number: 5,148,390
[45] Date of Patent: Sep. 15, 1992

[54] MEMORY CELL WITH KNOWN STATE ON POWER UP

[75] Inventor: Hung-Cheng Hsieh, Sunnyvale, Calif.

[73] Assignee: XILINX, Inc., San Jose, Calif.

[21] Appl. No.: 707,264

[22] Filed: May 24, 1991

Related U.S. Application Data

[60] Continuation of Ser. No. 544,071, Jun. 26, 1990, abandoned, which is a continuation of Ser. No. 328,840, Mar. 17, 1989, abandoned, which is a division of Ser. No. 201,509, Jun. 2, 1988, abandoned, which is a continuation-in-part of Ser. No. 777,670, Sep. 19, 1985, Pat. No. 4,750,155.

[51] Int. Cl.$^5$ .............................................. G11C 11/40
[52] U.S. Cl. ........................................ 365/95; 365/154
[58] Field of Search ............... 365/154, 190, 184, 95

[56] References Cited

U.S. PATENT DOCUMENTS

| | | | |
|---|---|---|---|
| 3,493,786 | 2/1970 | Ahrons et al. | 365/95 |
| 4,132,904 | 1/1979 | Harari | 365/154 X |
| 4,149,268 | 4/1979 | Waters | 365/95 |
| 4,333,166 | 6/1982 | Edwards | 365/154 X |
| 4,342,101 | 7/1982 | Edwards | 365/154 |
| 4,460,978 | 7/1984 | Jiang et al. | 365/154 |
| 4,799,194 | 1/1989 | Arakawa | 365/154 |

Primary Examiner—Joseph A. Popek
Attorney, Agent, or Firm—Edel M. Young

[57] ABSTRACT

A five transistor memory cell that can be reliably read and written from a single data line. The cell includes two inverters and a pass transistor. The cell read/write circuitry includes an address supply voltage source which is maintained at a first level during write and at a second level during read, selected to reduce read disturbance. The memory cell read circuitry includes a circuit for precharging the cell data line prior to reading. The state of the memory cell is continuously available at output nodes to control other circuitry even during the read operation. Selective doping of the pull-up transistors of the inverters in the memory cell controls the initial state of the memory cell after the memory cell is powered up.

12 Claims, 3 Drawing Sheets

MEMORY CELL WITH KNOWN STATE ON POWER UP

This is a continuation of application Ser. No. 07/544,071 filed Jun. 26, 1990, now abandoned, which is a continuation of application Ser. No. 07/328,840, filed Mar. 17, 1989, now abandoned, which is a divisional of application Ser. No. 07/201,509, filed Jun. 2, 1988 now abandoned, which is a continuation in part of application Ser. No. 06/777,670 filed Sep. 19, 1985 now U.S. Pat. No. 4,750,155.

FIELD OF THE INVENTION

This invention relates to a static memory cell and in particular to a five-transistor memory cell which can be reliably read and written.

BACKGROUND

FIG. 4 shows a prior art 6 transistor CMOS memory cell similar to the Intel 5101 cell. Transistors $T'_1$, $T'_2$, $T'_3$ and $T'_4$ constitute a cross-coupled latch that typically draws a steady state current of approximately one nanoampere. Transistors $T'_5$ and $T'_6$ are gating devices (pass transistors) that couple the bit lines (data lines) to the latch when the voltage on the row select line (address line) is high (5 volts). The output signal Q is a logical 1 when N channel enhancement mode transistor $T'_3$ is off and P channel enhancement mode transistor $T'_4$ is on, and it is a logical zero when these states are reversed. Reading and writing are accomplished through the left and right bit lines. For example to read the data out of the memory cell in FIG. 4, a high signal is applied to the row select, turning on transistors $T'_5$ and $T'_6$. If a logical 0 (0 volts) is on node A and a logical 1 (5 volts) is on node B, the left bit line is charged to a lower level than the right bit line. These two bit lines are typically connected to a differential amplifier (not shown) that amplifies the difference in voltage levels on the bit lines. The amplified difference is then interpreted as a logical 0 or a logical 1, according to some design convention.

To write a bit into the memory cell, the row select line is brought high (to 5 volts) and the left and right bit lines are charged to opposite states by the write driver (not shown in FIG. 4), which drives node A to the same logic level as the left bit line and node B to the same logic level as the right bit line.

The six transistor memory cell requires two gating devices (pass transistors) and two bit lines to be reliably read and written. Note that the six transistor memory cell can also be implemented in NMOS. See Holt, *Electronic Circuits*, John Wiley and Sons, Inc., pp. 293-294 (1978) which are incorporated herein by reference.

SUMMARY OF THE INVENTION

In contrast to the prior art, the present invention describes a five transistor memory cell which can be reliably read and written from a single data line. The memory cell includes a first and a second inverter with the output of the first inverter connected to the input of the second inverter and the output of the second inverter connected to the input of the first inverter and only a single gating (pass) transistor which is connected between the input lead of the first inverter and the single bit line.

In one embodiment of the invention the memory cell also includes a first and a second output node (lead) which continuously provides the state of the memory cell to circuitry external to the memory, for example to control the gates of external pass transistors or to provide an input signal to a logic gate.

Typically a plurality of five transistor memory cells are connected to the same data line. As one feature of the invention, means are provided for increasing the rise time on the gate of the pass transistor in order to reduce the possibility of disturbing the content of the memory cell during the read operation. As another feature of the invention, the trigger point of the first inverter is selected to be more than one threshold voltage with body effect below the voltage applied to the gate of the pass transistor and channel dimensions of the pass transistor relative to channel dimensions of the N channel and P channel transistors in the second inverter are selected to insure that the memory cell can be successfully written.

In another embodiment, circuitry is provided for precharging the data line to a first selected voltage level prior to reading a stored bit in order to reduce read disturbance.

In another embodiment circuitry is provided for charging the gate of the pass transistor to a first level during the read operation and to a second level during the write operation and for precharging the data line to a third selected voltage level prior to the read operation. The voltage levels are selected to minimize read disturbance.

The invention will be more readily understood by reference to the drawings and the detailed description.

BRIEF DESCRIPTION OF THE DRAWINGS

FIG. 3 also shows a precharge circuit for precharging the data line to a third selected voltage level prior to the read operation.

DETAILED DESCRIPTION

Figure 1:
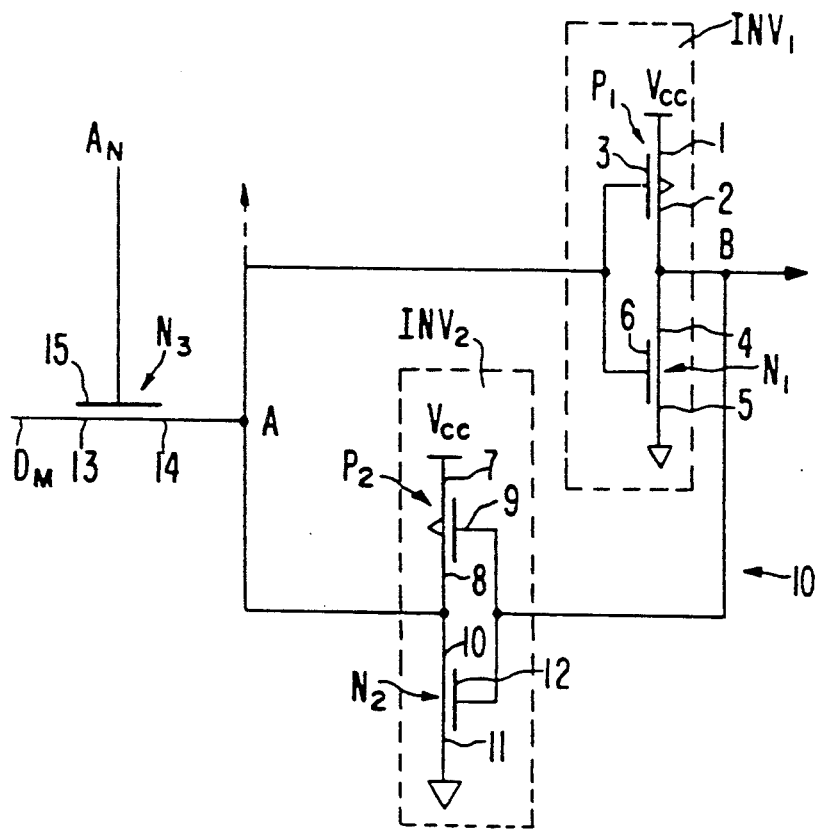
FIG. 1 shows a five transistor memory cell according to the present invention.

FIG. 1 shows one embodiment of memory cell 10 of the present invention. Memory cell 10 includes N channel enhancement mode pass transistor $N_3$ and inverters $INV_1$ and $INV_2$.

Inverter $INV_1$ includes P channel enhancement mode transistor $P_1$ and N channel enhancement mode transistor $N_1$. Source 1 of transistor $P_1$ is connected to the positive voltage supply having magnitude $V_{CC}$, which is typically 5 volts plus or minus 10% although other voltages may be employed for $V_{CC}$. Drain 2 of transistor $P_1$ is connected to drain 4 of transistor $N_1$ whose source is connected to ground. Gates 3 and 6 of transistors $P_1$ and $N_1$, respectively are connected to sense node A. The common drains 2 and 4 are connected to output node B.

Inverter $INV_2$ includes P channel enhancement mode transistor $P_2$ and N channel enhancement mode transistor $N_2$. Source 7 of transistor $P_2$ is connected to the positive voltage supply having magnitude $V_{CC}$. Drain 8 of transistor $P_2$ is connected to drain 10 of transistor $N_2$ whose source is connected to ground. Gates 9 and 12 of transistors $P_2$ and $N_2$, respectively, are connected to output node B. Drains 8 and 10 are connected to sense node A. In operation the output signal on node B is continuously available to other circuits (not shown in FIG. 1), for example, as a gate control signal for other transistors.

Data line $D_M$ is connected to sense node A via pass transistor $N_3$. Gate 15 of transistor $N_3$ is controlled by the voltage signal on address line $A_N$. Source/drain 13 of transistor $N_3$ is connected to data line $D_M$ and source/drain 14 of transistor $N_3$ is connected to sense node A.

One advantage of memory cell 10 is that while the signal on output node B is used, typically continuously, to control other circuits (not shown in FIG. 1), the content of memory cell 10 (i.e. the signal stored on node A) can be repeatedly checked by a read operation to verify the integrity of the memory cell's data content without degrading the output signal on node B. Furthermore, if desired, for example if the complement of the signal on node B is required to control other circuits, sense node A can also be used as an output node. This is indicated by the dotted arrow in FIG. 1. The voltage level at sense node A may be somewhat degraded during the read operation.

When sense node A stores a logical 0 and it is desired to write a logical 1 to cell 10, the signal provided at source/drain 14 of transistor $N_3$ must be sufficient to increase the voltage on sense node A above the trigger point of inverter $INV_1$ despite the pulldown effect of current flowing through transistor $N_2$ of inverter $INV_2$ (the trigger point of an inverter is the voltage at which the gate (input) voltage of the inverter equals the output voltage of the inverter). Conversely, when sense node A stores a logical 1 and it is desired to write a logical 0 to sense node A, the signal provided at source/drain 14 of transistor $N_3$ must be sufficient to decrease the voltage on sense node A below the trigger point of inverter $INV_1$ despite the pullup effect of transistor $P_2$ of inverter $INV_2$.

The operation of writing data into cell 10 and the selection of the parameters for transistors $N_1$, $N_2$, $N_3$, $P_1$, and $P_2$ may be understood by considering the following examples.

EXAMPLE 1

Suppose that memory cell 10 stores a logical 0, i.e. the voltage on node A is 0 volts (logical 0) and that the output signal of inverter $INV_1$ is $V_{CC}$ (logical 1). Suppose that a logical 1 having a voltage level of $V_{CC}$ on data line $D_M$ is to be written to node A and that transistor $N_3$ is turned on by applying the signal $V_{CC}$ to gate 15. A voltage level of $V_{CC}$ on source/drain 13 and a voltage level of $V_{CC}$ on gate 15 results in a voltage on source/drain 14 not higher than $V_{CC}-V_{TH}(N_3)$. $V_{TH}(N_3)$ is the threshold voltage of transistor $N_3$ with body effect. Thus the trigger point of inverter $INV_1$, denoted by $V_{TRIG}(INV_1)$, is selected to be less than $V_{CC}-V_{TH}(N_3)$. This is accomplished by selecting the ratio of the ratio of the channel width to channel length of pullup transistor $P_1$ to the ratio of channel width to channel length of pulldown transistor $N_1$ of inverter $INV_1$ to be sufficiently small. For example, if $V_{CC}$ equals 5 volts and the channel width and channel length of transistors $N_1$ and $P_1$ are as given in the following table:

| Transistor | Channel Width | Channel Length |
|---|---|---|
| $P_1$ | 5 μm | 2.5 μm |
| $N_1$ | 9.75 μm | 2.5 μm | then the trigger point of inverter $INV_1$ will be less than 2 volts. Having selected the channel width and channel length of transistors $P_1$ and $N_1$ so that the trigger point of inverter $INV_1$ is less than $V_{CC}-V_{TH}(N_3)$ the channel dimensions of $N_2$ relative to the channel dimensions of $N_3$ are selected so that the voltage at node A rises above the trigger point TP of inverter $INV_1$. When transistors $N_3$ and $N_2$ are both on, they act as a voltage divider, and the voltage at sense node A is given by $V_{CC} \times (R(N_2)/(R(N_2)+R(N_3)))$ where $R(N_2)$ is the channel resistance provided by transistor $N_2$, and $R(N_3)$ is the channel resistance provided by transistor $N_3$. $R(N_2)$ is directly proportional to $L(N_2)/W(N_2)$ and $R(N_3)$ is directly proportional to $L(N_3)/W(N_3)$ where $L(N_2)$ is the channel length of transistor $N_2$, $W(N_2)$ is the channel width of transistor $N_2$, $L(N_3)$ is the channel length of transistor $N_3$ and $W(N_3)$ is the channel width of transistor $N_3$. By appropriately choosing the channel length and channel widths, we may ensure that $V_{CC} \times (R(N_2)/(R(N_2)+R(N_3)))$ is greater than the trigger point TP of inverter $INV_1$. In one embodiment, the channel length of pass transistor $N_3$ is 2.5 microns and the channel width is 7.5 microns. Transistor $N_2$ has a channel length of 4 microns and a channel width of 4 microns. In this case $R(N_2)/(R(N_2)+R(N_3))$ equals 0.6. Hence the voltage on node A will rise above the trigger point of inverter $INV_1$. Once the voltage on sense node A rises above the trigger point, $V_{TRIG}(INV_1)$, the output signal on node B goes low and the output signal of inverter $INV_2$ goes high driving sense node A to the $V_{CC}$ level.

EXAMPLE 2

In writing a logical 0 to memory cell 10, assume the voltage on data line $D_M$ is 0 volts, address line $A_N$ is charged to $V_{CC}$, and a voltage signal $V_{CC}$ (logical 1) is stored on node A. When both transistors $P_2$ and $N_3$ are on, pullup transistor $P_2$ in inverter $INV_2$ and transistor $N_3$ act as a voltage divider and the voltage at sense node A is given by $V_{CC} (R(N_3)/(R(N_3)+R(P_2)))$ where $R(P_2)$ is the channel resistance provided by transistor $P_2$ and $R(N_3)$ is the channel resistance provided by transistor $N_3$. The channel resistance of $P_2$ is directly proportional to $L(P_2)/W(P_2)$ where $L(P_2)$ is the channel length of transistor $P_2$ and $W(P_2)$ is the channel width of transistor $P_2$. The channel resistance of N channel transistor $N_3$ is directly proportional to $L(N_3)/W(N_3)$ where $L(N_3)$ is the channel length of transistor $N_3$ and $W(N_3)$ is the channel width of transistor $N_3$. These channel lengths and widths are chosen so that the voltage on sense node A falls below the trigger point of inverter $INV_1$. In one embodiment, transistor $P_2$ in inverter $INV_2$ has a channel length of 4 microns and a channel width of 6 microns. The fraction $R(N_3)/(R(N_3)+R(P_2))$ equals 0.1. In this case, the voltage on sense node A will fall below the trigger point of inverter $INV_1$ where the channel dimensions of inverter $INV_1$ are specified in the above table. Once the voltage on sense node A falls below the trigger point, the output signal on node B goes high and the output signal of inverter $INV_2$ goes low driving sense node A to 0 volts. The above analysis assumes that the channel resistance of the pullup and pulldown transistors of the write driver (not shown) are significantly smaller (less than 10%) than the channel resistance of transistors $P_2$, $N_2$ and $N_3$.

It is also desirable to be able to read the data signal stored on sense node A by transmitting this signal via pass transistor $N_3$ to data line $D_M$ without disturbing the content of the memory. The value read is the value that appears on source/drain 13 of transistor $N_3$. Typically data line $D_M$, which may be connected to many cells similar to cell 10 of FIG. 1, has a large capacitance compared to the capacitance of sense node A. When address line $A_N$ goes high to turn on pass transistor $N_3$ in order to read the value stored on node A, the content of the memory (the value stored on node A) may be disturbed due to charge sharing. The following techniques can be employed to reduce the danger of disturbing the memory cell during the read operation. First, one may increase the rise time of the address line $A_N$ by slowing the rate of increase of the voltage of address line $A_N$. Then transistor $N_3$ turns on more slowly, allowing memory cell 10 to react to the disturbance caused by charge sharing without changing the content of the data stored on node A. For example, if $V_{CC}$ is stored on node A, the rise time must be sufficiently long that the voltage on node A does not fall to $V_{TRIG}(INV_1)$ when transistor $N_3$ turns on. If 0 volts is stored on node A, the rise time of the signal on address $A_N$ must be sufficiently long that the voltage on node A does not rise to $V_{TRIG}(INV_1)$ when transistor $N_3$ turns on. A typical address rise time should be 200 ns or more. The rise time of address line $A_N$ is increased by using a "weak" (small channel width to channel length ratio) pullup transistor (not shown) in the address driver.

A second technique for avoiding disturbing the content of cell 10 during the read operation is to precharge the data line $D_M$ to the value $V_{TRIG}(INV_1)$.

Assume data line $D_M$ is precharged to the value $V_{TRIG}(INV_1)$. Assume also that a read signal of magnitude $V_{CC}$ is applied to address line $A_N$. If $V_{CC}$ (logical 1) is stored on sense node A, then pullup transistor $P_2$ of inverter $INV_2$ and pass transistor $N_3$ form a voltage divider network and sense node A does not fall below $V_{TRIG}(INV_1)$. Similarly, if 0 volts (logical 0) is stored on sense node A, then sense node A does not rise above $V_{TRIG}(INV_1)$, since in this event transistors $N_2$ and $N_3$ form a resistor divider network and data line $D_M$ is precharged to $V_{TRIG}(INV_1)$. In one embodiment, the circuit shown in FIG. 2 is used to precharge data line $D_M$ to $V_{TRIG}(INV_1)$.

Figure 2:
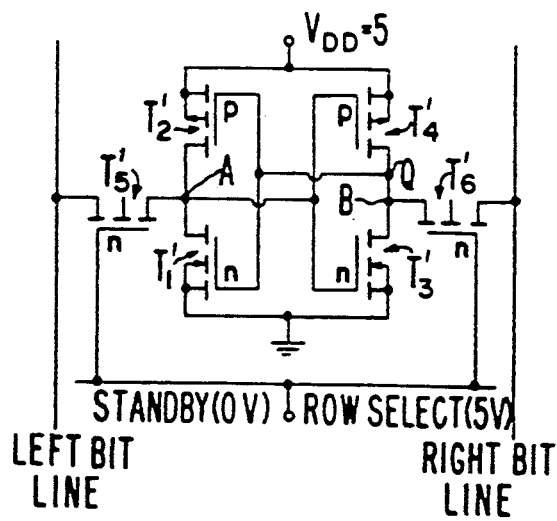
FIG. 2 shows a circuit for precharging the data line for the memory cell shown in FIG. 1.
Figure 4:
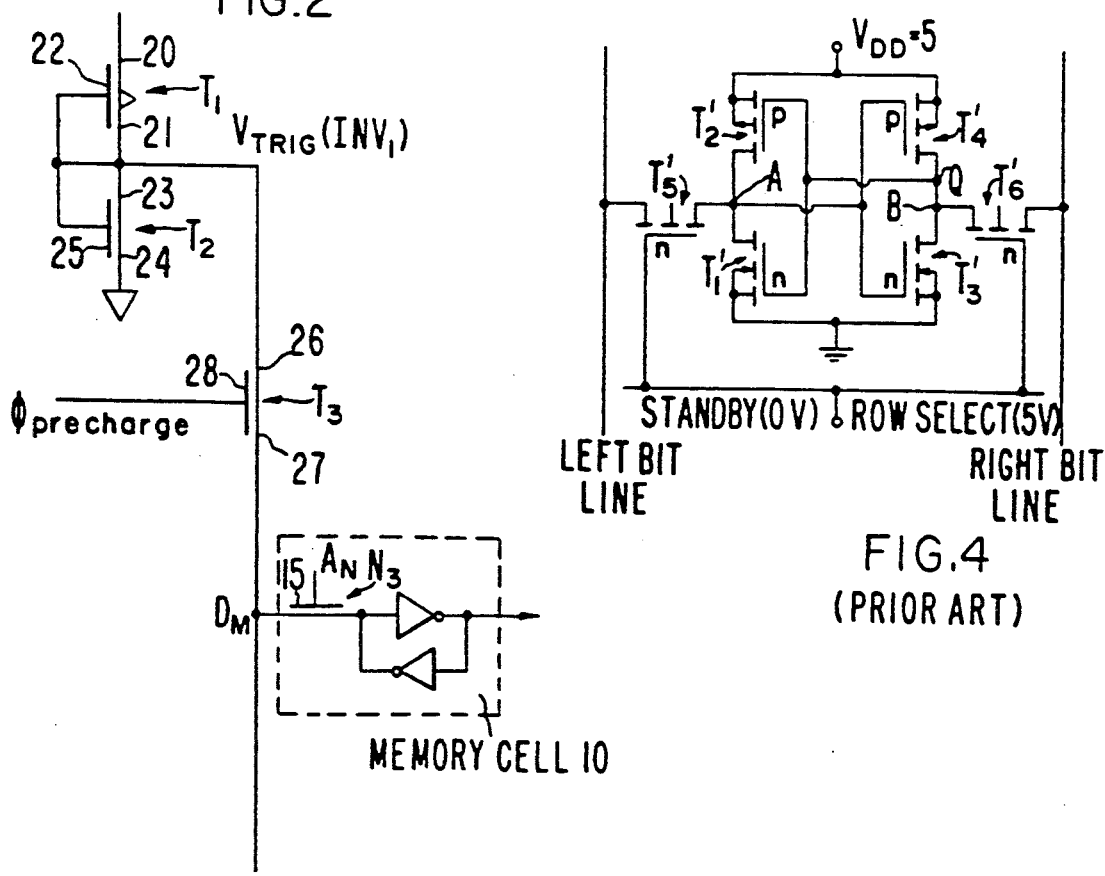
FIG. 4 shows a prior art six transistor memory cell.

The $V_{TRIG}(INV_1)$ precharge circuit shown in FIG. 2 includes P channel enhancement mode transistor $T_1$, N channel enhancement mode transistor $T_2$, and N channel enhancement mode pass transistor $T_3$. As shown in FIG. 2, source 20 of transistor $T_1$ is connected to the positive voltage supply $V_{CC}$. Drain 21 of transistor $T_1$ is connected to drain 23 of transistor $T_2$ whose source 24 is connected to ground. Gates 22 and 25 of transistors $T_1$ and $T_2$, respectively, are connected to the common drain connection of transistors $T_1$ and $T_2$ which also connects to drain 26 of pass transistor $T_3$. Source 27 of transistor $T_3$ is connected to data line $D_M$ and gate 28 of transistor $T_3$ is connected to precharge signal, $\phi_{precharge}$. The "inverter" comprising transistors $T_1$ and $T_2$ is designed to have the same trigger point as inverter $INV_1$, shown in FIG. 1. In the precharge cycle, the precharge signal, $\phi_{precharge}$, is set to $V_{CC}$, which turns on N channel pass transistor $T_3$, and data line $D_M$ is precharged to a voltage level of $V_{TRIG}(INV_1)$ (assuming $V_{TRIG}(INV_1)$ is lower than the voltage level of $\phi_{precharge}$ minus $V_{TH,T3}$). The precharge signal $\phi_{precharge}$ is then brought low by control circuitry (not shown), turning off pass transistor $T_3$ just before the address line $A_N$ connected to gate 15 of pass transistor $N_3$ is brought high.

The third technique for avoiding disturbing the content of memory cell 10 during the read operation is to precharge data line $D_M$ to $V_{CC}$ and set the high level of address line $A_N$ to the value $V_{TRIG}(INV_1)$. These conditions are implemented using the circuitry shown in FIG. 3. Under these conditions, when the value stored in cell 10 is $V_{CC}$ (logical 1), pass transistor $N_3$ remains off and the value sensed at source/drain 13 is $V_{CC}$ (logical 1), and sense node A is undisturbed. On the other hand, when the value stored in cell 10 is 0 volts (logical 0), the highest voltage that sense node A can be charged to is $V_{TRIG}(INV_1) - V_{TH}(N_3)$ since $N_3$ is cut off when the voltage on source/drain 14 reaches this value. Hence the read "0" operation has a noise margin of $V_{TH}(N_3)$. This is the preferred technique because the memory cell 10 is guaranteed not to be disturbed by the read operation regardless of the rise time of address line $A_N$, the imbalance between the capacitance on the data line $D_M$ and the capacitance on the sense node A, or the ratio of channel resistance between transistor $N_3$ and transistor $P_2$ or $N_2$. This third technique requires that the address line $A_N$ be charged to $V_{CC}$ for a write operation and to $V_{TRIG}(INV_1)$ during a read operation. Symbolically, $$V_{ADDRESS\ SUPPLY} = \begin{matrix} V_{CC} \text{ during write} \\ V_{TRIG}(INV_1) \text{ during read} \end{matrix}$$

Figure 3:
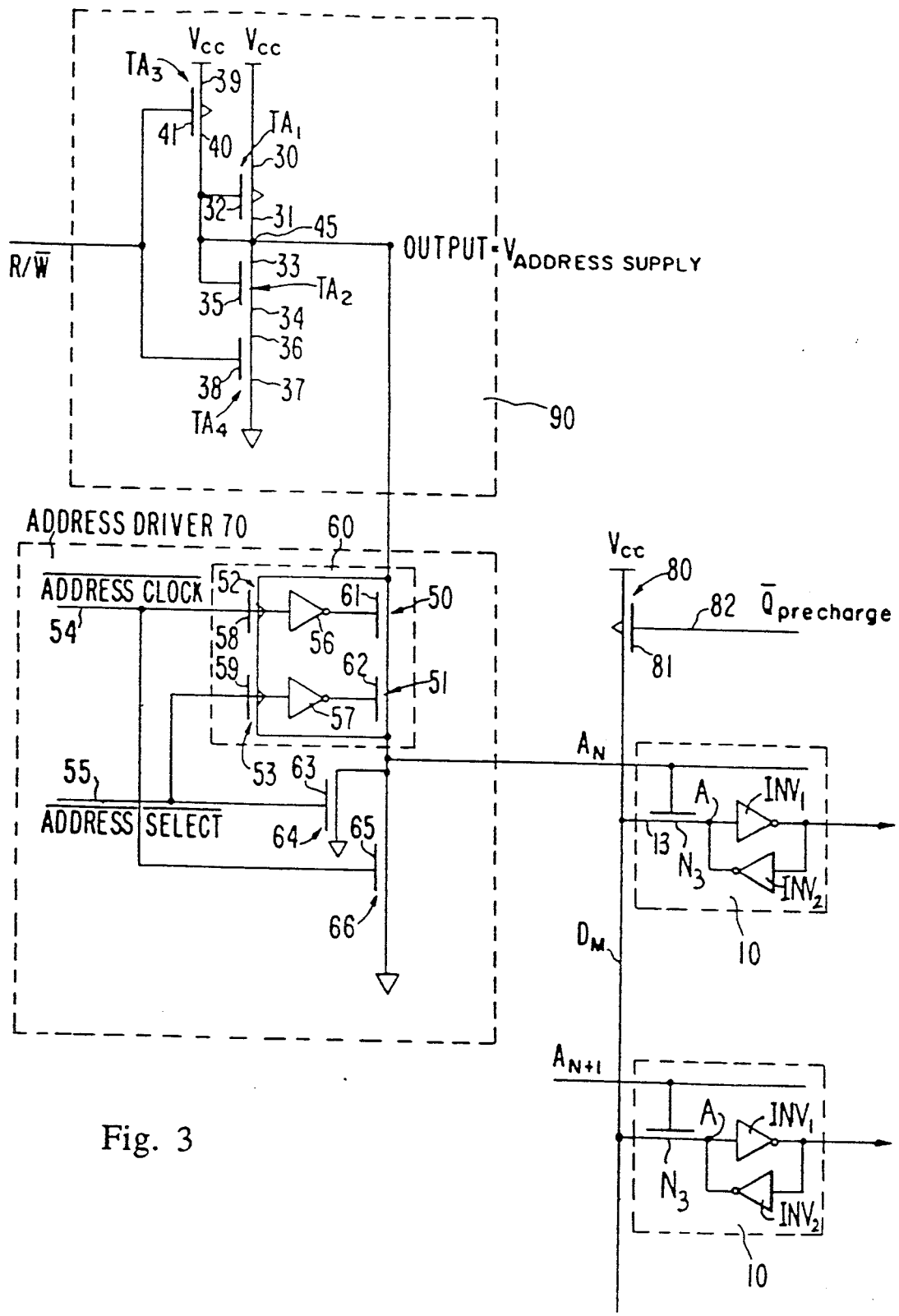
FIG. 3 shows an address supply voltage source and an address driver for supplying a first selected voltage level to the address line for the memory cell of FIG. 1 during the read operation and a second selected voltage level during the write operation.

The address supply voltage source can be implemented as shown in FIG. 3. Address supply circuit 90 shown in FIG. 3 includes P channel enhancement mode transistor $TA_1$, N channel enhancement mode transistor $TA_2$, N channel enhancement mode transistor $TA_4$, and P channel enhancement mode transistor $TA_3$. As shown in FIG. 3, source 30 of transistor $TA_1$ is connected to the positive voltage supply $V_{CC}$. Drain 31 of transistor $TA_1$ is connected to drain 33 of transistor $TA_2$ whose source 34 is connected to drain 36 of transistor $TA_4$ whose source 37 is connected to ground. Source 39 of P channel transistor $TA_3$ is connected to $V_{CC}$ and drain 40 of transistor $TA_3$ is connected to gates 32 and 35 of transistors $TA_1$ and $TA_2$ and to the common drain connection of transistors $TA_1$ and $TA_2$. Gates 41 and 38 of transistors $TA_3$ and $TA_4$ are controlled by the signal on line R/W. In the write mode, a signal of 0 volts is applied to line R/W, which turns off N channel transistor $TA_4$. P channel transistor $TA_3$ then charges $V_{ADDRESS\ SUPPLY}$ to $V_{CC}$. Note that transistor $TA_3$ should be designed to be sufficiently large to provide the current to address driver 70 to charge up address line $A_N$ in the write mode. In the read mode, $V_{CC}$ (logical 1) is applied to line R/W. This turns P channel transistor $TA_3$ off and turns on N channel transistor $TA_4$. By appropriately choosing channel lengths and channel widths, the circuit comprising transistor $TA_1$, transistor $TA_2$ and transistor $TA_4$ is designed such that the voltage at the output node 45, $V_{ADDRESS\ SUPPLY}$ is the same as the trigger point of inverter $INV_1$ shown in FIG. 1. Thus, $V_{ADDRESS\ SUPPLY}$ is equal to $V_{TRIG}(INV_1)$. Note that transistor $TA_1$ should be designed to be sufficiently large to provide the current to address driver 70 to charge up address line $A_N$ in the read mode. In one embodiment, transistors $TA_1$ and $TA_3$ have a channel length of 2.5 microns and a channel width of 30 microns and transistors $TA_2$ and $TA_4$ have a channel length of 2.5 microns and a channel width of 108 microns.

Address driver 70 is logically a NOR gate having input lead 54 for receiving the signal $\overline{\text{address clock}}$ and input lead 55 for receiving the signal $\overline{\text{address select}}$.

Lead 54 provides the signal $\overline{\text{address clock}}$ to gate 58 of P channel enhancement mode transistor 52 and to inverter 56 whose output signal controls gate 61 of N channel enhancement mode transistor 50. Lead 54 is also connected to gate 65 of N channel enhancement mode transistor 66.

Lead 55 provides the $\overline{\text{address select}}$ signal to gate 59 of P channel enhancement mode transistor 53 and to inverter 57 whose output signal controls gate 62 of N channel enhancement mode transistor 51. Lead 55 is also connected to gate 63 of N channel enhancement mode transistor 64.

Transistors 50, 51, 52, and 53 comprise four transmission gates forming two parallel pairs of gates with the gates of each pair connected in series. Note that when signals $\overline{\text{address clock}}$ and $\overline{\text{address select}}$ are both low (0 volts) all four transistors 50, 51, 52 and 53 are on and N channel transistors 64 and 66 are off and thus the voltage $V_{ADDRESS\ SUPPLY}$ is transmitted to address line $A_N$.

P channel enhancement mode transistor 80 is connected between the voltage supply $V_{CC}$ and data line $D_M$. Data line $D_M$ is precharged to $V_{CC}$ by applying a low (0 volts) $\phi_{precharge}$ signal to gate 81 on lead 82.

The third technique described above in conjunction with FIG. 3 can be modified by replacing P channel transistor 80 by an N channel enhancement mode transistor (not shown) whose gate is controlled by the signal $\overline{\phi_{precharge}}$, the complement of $\phi_{precharge}$. In this embodiment, the data line is precharged to $V_{CC}$-$V_T$ where $V_T$ is the threshold voltage of the N channel transistor.

Typically a plurality of memory cells identical to cell 10 are connected to data line $D_M$. FIG. 3 shows two such memory cells having address lines $A_N$ connected to address driver 70 and $A_{N+1}$ which is connected to a corresponding address driver (not shown). In another embodiment (not shown), a rectangular memory array is formed which comprises a plurality of data lines, a plurality of address lines, and a plurality of memory cells, the memory cells attached to a given one of said data lines forming a column in the array and the memory cells attached to a given one of the address lines forming a row in the rectangular array.

The above embodiments are intended to be exemplary and not limiting. For example, while the circuits described above are implemented using CMOS technology, they may also be implemented using NMOS technology.

There can be a problem in some logic arrays if a random initial memory state on power-up causes devices controlled by the memory cells in the array to become shorted together. The shorting may cause the devices controlled by the memory cells to become unprogrammable or even damaged. This is a noticeable problem for large arrays. It is therefore desirable to control the initial memory state of the memory cells on power-up.

According to a preferred embodiment of this invention, in which the two inverters INV1 and INV2 of FIG. 1 are both CMOS, each having a p-channel pull-up transistor, P1 and P2 respectively, the two p-channel transistors P1 and P2 are differentially doped to exhibit different threshold voltages. Before power-up, all nodes in the memory cell, in particular nodes A and B, will have a voltage level of 0 volts. At power-up, as the Vcc voltage level is rising from 0 volts to the supply voltage level, the p-channel transistor requiring the lowest voltage difference between the gate and source will turn on first. In the circuit of FIG. 1, according to one preferred embodiment, transistor P2 is manufactured to have a threshold voltage of $-0.7$ volts while transistor P1 is manufactured to have a threshold voltage of $-1.6$ volts. During power-up, a low voltage applied at terminal AN to gate 15 of transistor N3 causes pass transistor N3 to be off. As the Vcc voltage level passes 0.7 volts, the gate voltages on gates 3, 6, 9, and 12 remain approximately 0 volts. Therefore, transistor P2 will begin to turn on. The increasing Vcc voltage level will then be placed by p-channel transistor P2 onto node A, which will in turn apply this increasing level to gate 3 of p-channel transistor P1, thus preventing the gate to source voltage of transistor P1 from reaching the threshold voltage of $-1.6$ volts during power-up. Thus at the completion of power-up the memory cell is in the known state in which node A is at a logical 1 and node B is at a logical 0.

In order to achieve the opposite initial state, the threshold voltage of transistor P1 can be manufactured to be lower than that of transistor P2. It is preferred, however, that all memory cells in a given array be manufactured so that they adopt the same initial state on power-up, in order that the ratios of channel length and channel width of the pass transistor and second inverter of each cell throughout the array, and the trigger points of inverters throughout the array can be consistent throughout the array. If it is desired that some devices controlled by memory cells be initialized at a logical one and others at a logical zero, then some devices can be controlled from node A of their respective memory cells and others can be controlled from node B of their respective memory cells.

The threshold voltages can be adjusted somewhat by adjusting the channel length of the transistors rather than by varying doping level. Transistors with shorter channel length have a somewhat lower threshold voltage than transistors with a longer channel length. However, a more sensitive method, and the preferred method of controlling threshold voltage is to dope the two p-channel transistors P1 and P2 differently. According to a preferred method of forming the structure, the doping level in the channel of transistor P2 is not changed from that of the n-well in which it is formed whereas the doping level of transistor P1 is increased during a separate masking process, during which the channel of transistor P2 is masked so as not to be affected.

Figure 5:
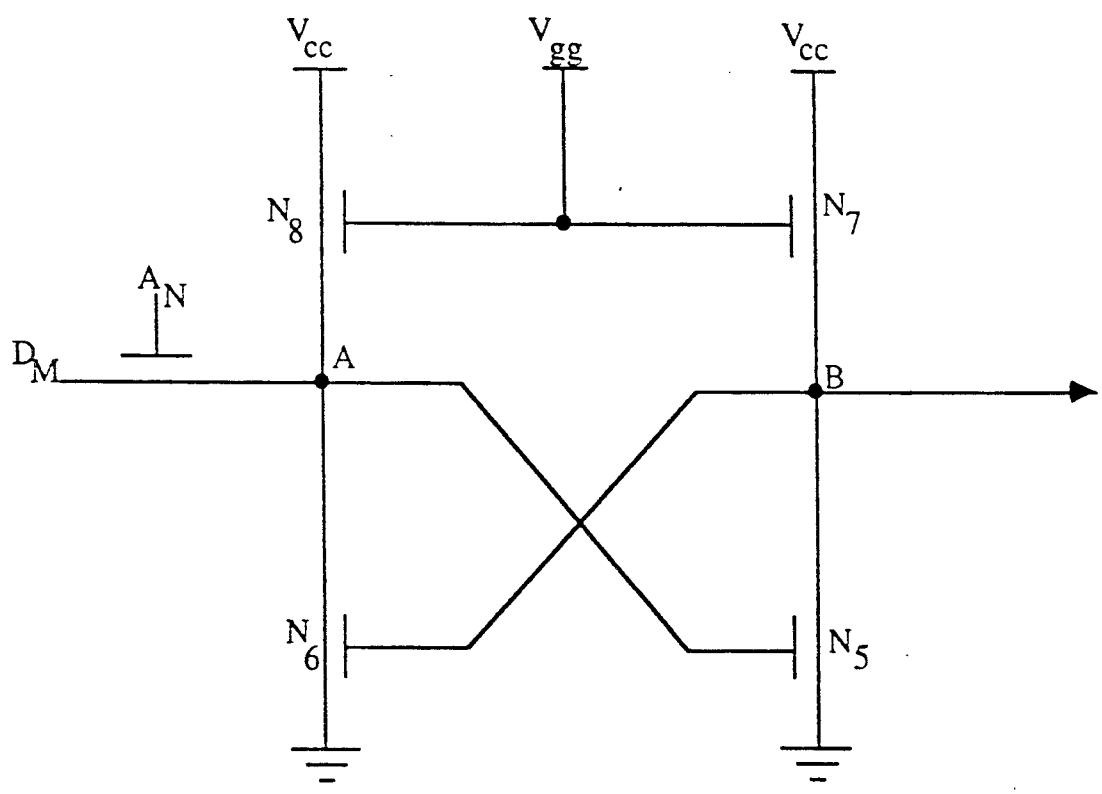
FIG. 5 shows a five transistor memory cell of the present invention using NMOS technology.

The same principle described above with respect to a CMOS memory cell can also be applied to the NMOS memory cell shown in FIG. 5. In FIG. 5, transistors N5 and N6 are equivalent to transistors N1 and N2 respectively of FIG. 1. N-channel transistors N7 and N8 form resistive loads for the memory cell, being controlled by a voltage Vgg applied to their gates. Transistor N7 in one embodiment is manufactured to have a threshold voltage VtN7 of 0.7 volts while transistor N8 is manufactured to have a threshold voltage VtN8 of 1.6 volts. Thus, on power-up, as voltages Vcc and Vgg rise above 0.7 volts, transistor N7 will begin to turn on while transistor N8 remains off. Thus the voltage at node B will rise to Vgg-VtN7 and this voltage will in turn be applied to the gate of transistor N6. As the voltage Vgg-VtN7 rises above the threshold voltage of transistor N6, transistor N6 begins to turn on, pulling node A to ground, and holding transistor N5 off. As the voltage Vgg rises above 1.6 volts, transistor N8 will begin to turn on. By selecting the ratio of channel width to channel length of transistor N8 to be significantly less than the ratio of channel width to channel length of transistor N6, when both transistors N6 and N8 turn on the voltage level at node A is a logical "0". Thus on the completion of power-up, the cell of FIG. 5 is in a known state in which node B provides a logical "1" and node A provides a logical "0".

In the embodiment of FIG. 5, it is possible for Vgg to be equal to Vcc. However, because this NMOS embodiment consumes a steady state current (in the above example, when node A is at logical "0" there is steady state current from Vcc through transistors N8 and N6 to ground), it is preferred that Vgg be separately controlled so that the Vgg voltage can be lowered to increase resistance of transistors N7 and N8, and thereby save power, or so that the cell can be turned off altogether when not in use.

Many other modifications will become obvious to one of average skill in the art in light of the above disclosure and are included within the scope of the invention.

What is claimed is:

1. A memory circuit comprising:
   a first memory transistor and a second memory transistor;
   a first load transistor and a second load transistor;
   each of said memory and load transistors having a channel, a gate, a source, and a drain, said gate controlling conductivity of said channel between said source and said drain;
   means for connecting said drain of said first memory transistor, said drain of said first load transistor, and said gate of second memory transistor together;
   means for connecting said drain of said second memory transistor, said drain of said second load transistor, and said gate of said first memory transistor together;
   means for connecting said gates of said first and second load transistors to a first voltage supply;
   means for connecting said sources of said first and second load transistors to a second voltage supply;
   means for connecting said sources of said first and second memory transistors to a third voltage supply;
   wherein a threshold voltage of said first load transistor is selected to be sufficiently lower than a threshold voltage of said second load transistor that upon power-up said drain of said first memory transistor provides a logical one and said drain of said second memory transistor provides a logical zero;
   said channel of said first load transistor being doped less heavily than said channel of said second load transistor.

2. A memory circuit as in claim 1 further comprising means for connecting said gate of said second memory transistor to an input signal line.

3. A memory circuit as in claim 2 in which said means for connecting is a pass transistor having a drain connected to said gate of said second memory transistor, a source connected to said input signal line and a gate connected to a means for controlling.

4. A memory circuit as in claim 1 further comprising means for connecting said gate of said first memory transistor to an input signal line.

5. A memory circuit as in claim 4 in which said means for connecting is a pass transistor having a drain connected to said gate of said first memory transistor, a source connected to said input signal line and a gate connected to a means for controlling.

6. A memory circuit as in claim 1 further comprising means for connecting said gate of said second memory transistor to an output signal line.

7. A memory circuit as in claim 1 further comprising means for connecting said gate of said first memory transistor to an output signal line.

8. A memory circuit as in claim 1 in which said first and second voltage supplied are the same.

9. A memory circuit as in claim 1 in which said first voltage supply is lower than said second voltage supply.

10. A memory circuit as in claim 1 in which a channel of said first load transistor is not doped more heavily than a well in which said channel of said first load transistor is located and a channel of said second load transistor is doped more heavily than a well in which said channel of said second load transistor is located.

11. A memory circuit as in claim 1 in which the channel length of said first load transistor is smaller than the channel length of said second load transistor.

12. A memory circuit as in claim 1 in which the ratio of channel width to channel length of said second load transistor is less than the ratio of channel width to channel length of said second memory transistor.

* * * * *

UNITED STATES PATENT AND TRADEMARK OFFICE
CERTIFICATE OF CORRECTION

PATENT NO. : 5,148,390
DATED : September 15, 1992
INVENTOR(S) : Hung-Cheng Hsieh (Deceased)

It is certified that error appears in the above-identified patent and that said Letters Patent is hereby corrected as shown below:

Col. 7, line 10, "address clock" should read --$\overline{\text{address clock}}$--.

Col. 7, line 32, "$\phi_{precharge}$" should read --$\overline{\phi}_{precharge}$--.

Col. 7, line 37, the second use of "$\phi_{precharge}$" should read --$\overline{\phi}_{precharge}$--.

Signed and Sealed this

Twenty-sixth Day of April, 1994

BRUCE LEHMAN

Attest:

Attesting Officer

Commissioner of Patents and Trademarks